(12) United States Patent
Chen et al.

(10) Patent No.: US 9,846,492 B2
(45) Date of Patent: Dec. 19, 2017

(54) OPTICAL SWITCH KEYBOARD

(71) Applicant: Primax Electronics Ltd., Neihu, Taipei (TW)

(72) Inventors: Chung-Yuan Chen, Taipei (TW); Wei-Ping Chan, Taipei (TW)

(73) Assignee: Primax Electronics Ltd., Taipei (TW)

( * ) Notice: Subject to any disclaimer, the term of this patent is extended or adjusted under 35 U.S.C. 154(b) by 114 days.

(21) Appl. No.: 15/131,842

(22) Filed: Apr. 18, 2016

(65) Prior Publication Data

US 2017/0115747 A1    Apr. 27, 2017

Related U.S. Application Data

(60) Provisional application No. 62/244,920, filed on Oct. 22, 2015.

(30) Foreign Application Priority Data

Mar. 11, 2016    (TW) .............................. 105107582 A

(51) Int. Cl.
*G06F 3/02*    (2006.01)
*G06F 3/03*    (2006.01)

(52) U.S. Cl.
CPC .......... *G06F 3/0304* (2013.01); *G06F 3/0202* (2013.01)

(58) Field of Classification Search
CPC ................................. G06F 1/1662; G06F 3/02
USPC .................................................. 345/168, 170
See application file for complete search history.

(56) References Cited

U.S. PATENT DOCUMENTS

| 5,266,949 A † | 11/1993 | Rossi | |
| 6,369,800 B1 * | 4/2002 | Nading | G06F 3/0202 200/314 |
| 7,855,715 B1 * | 12/2010 | Bowen | G06F 3/0234 345/168 |
| 2016/0306437 A1 * | 10/2016 | Zhang | G06F 3/0202 |

\* cited by examiner
† cited by third party

*Primary Examiner* — Roy Rabindranath
(74) *Attorney, Agent, or Firm* — Kirton McConkie; Evan R. Witt

(57) ABSTRACT

An optical switch keyboard includes a circuit board and plural keys. The circuit board includes plural light emitters and plural light receivers. Each key is aligned with the corresponding light emitter and the corresponding light receiver. Moreover, each key includes a triggering element, a first reflective element and a second reflective element. When the triggering element is triggered by the user, a sensing light emitted by the light emitter is reflected to the second reflective element by the first reflective element. The sensing light is further reflected to the light receiver by the second reflective element. Consequently, the circuit board generates a key switch signal.

23 Claims, 6 Drawing Sheets

OPTICAL SWITCH KEYBOARD

FIELD OF THE INVENTION

The present invention relates to a keyboard, and more particularly to an optical switch keyboard.

BACKGROUND OF THE INVENTION

Generally, keyboards are essential peripheral devices of computers. A keyboard is usually equipped with plural keys. By depressing one of the plural keys, the user can input a message or a command into the computer. Conventionally, different methods are provided to generate key signals according to the types of the keys. For example, in case that the key is a mechanical key, a metallic elastic strip is used to trigger a circuit switch to generate the key signal. Whereas, in case that the key is an optical switch key, a key switch signal is generated when a sensing light is received or obstructed.

In the conventional optical switch key, a light emitter and a light receiver are installed in the single key. When the light beam emitted by the light emitter is received or not received by the light receiver, the key switch signal is generated. However, since the light emitter and the light receiver are installed in the key, the structure of the key becomes more complicated. Moreover, it is difficult to adjust or correct the optical path. If the light emitter or the light receiver is defective, the entire of the key has to be replaced with a new one. That is, the maintenance cost is increased and the maintaining process is complicated. Moreover, the light beam in the key is easily influenced by other stray lights, for example the lights generated by a backlight module of the keyboard. Under this circumstance, the light beam is erroneously received by the light receiver, and thus the signal is misjudged by the light receiver. Therefore, the conventional optical switch key needs to be further improved.

SUMMARY OF THE INVENTION

For solving the drawbacks of the conventional technologies, the present invention provides an optical switch keyboard. A light emitter and a light receiver of the optical switch keyboard are located at the outside of the key. Consequently, the structure of the key will be simplified, and the optical components can be replaced and adjusted more easily. Moreover, the optical switch keyboard has the functions of filtering other stray lights and noise, and thus the sensitivity and accuracy of the optical key in judgment are both enhanced.

In accordance with an aspect of the present invention, there is provided an optical switch keyboard. The optical switch keyboard includes a circuit board and plural keys. The circuit board includes plural light emitters and plural light receivers. Each light emitter emits a sensing light. Moreover, each light receiver generates an electronic signal when the sensing light from the corresponding light emitter is received by the light receiver. The plural keys are located over the circuit board. Each key is aligned with the corresponding light emitter and the corresponding light receiver. Each key includes a keycap, a housing, a first reflective element and a triggering post. The housing is located under the keycap. The first reflective element is disposed within the housing and located over the light emitter. The sensing light is reflected by the first reflective element. The triggering post is connected with the keycap and inserted into housing. A second reflective element is connected with the triggering post and located over the light receiver. When the triggering post is in a first position, the sensing light from the first reflective element is not received by the second reflective element. When the triggering post is in a second position, the sensing light from the first reflective element is received by the second reflective element and the sensing light is reflected to the light receiver by the second reflective element, so that the circuit board generates a key switch signal according to the electronic signal.

In an embodiment, when the triggering post is in the second position, the second reflective element is in an optical path of the sensing light, and the sensing light is reflected to the light receiver by the second reflective element.

In an embodiment, the light emitter and the light receiver are located at an outside of the housing, so that the sensing light is introduced into the housing from the outside of the housing and the sensing light is reflected to the outside of the housing.

In an embodiment, the key further includes a filter. The filter is disposed on the housing and arranged between the second reflective element and the light receiver for filtering the sensing light.

In an embodiment, a light-inputting opening and a light-outputting opening are formed in a bottom surface of the housing. The light-inputting opening is located over the light emitter, and the sensing light is introduced into the housing through the light-inputting opening The light-outputting opening is located over the light receiver, and the sensing light is outputted from the housing through the light-outputting opening In an embodiment, the key further includes a filter, and the filter is disposed on the bottom surface of the housing and aligned with the light-outputting opening.

In an embodiment, the first reflective element has a first reflective slant surface, and the second reflective element has a second reflective slant surface.

In an embodiment, the first reflective element and the second reflective element are prisms.

In an embodiment, the light emitter and the light receiver are disposed on the circuit board.

In an embodiment, the sensing light is an invisible light.

In an embodiment, the sensing light is an infrared light.

In an embodiment, the key further includes a light emitting diode and a light guide element. The light emitting diode is disposed on a surface of the circuit board. The light guide element is disposed within the housing. The light emitting diode emits a light beam. The light beam is guided by the light guide element so as to be outputted from the keycap.

In accordance with an aspect of the present invention, there is provided an optical switch keyboard. The optical switch keyboard includes a circuit board and plural keys. The circuit board includes plural light emitters and plural light receivers. Each light emitter emits a sensing light. Moreover, each light receiver generates an electronic signal when the sensing light from the corresponding light emitter is received by the light receiver. The plural keys are located over the circuit board. Each key is aligned with the corresponding light emitter and the corresponding light receiver. Each key includes a keycap, a housing, a triggering post and a second reflective element. The housing is located under the keycap. The triggering post is disposed within the housing and connected with the keycap. A first reflective element is connected with the triggering post and located over the light emitter. The sensing light is reflected by the first reflective element. The second reflective element is connected with the housing and located over the light receiver. When the triggering post is in a first position, the sensing light from the first reflective element is not reflected to the second reflective element. When the triggering post is in the second position, the sensing light from the first reflective element is reflected to the second reflective element and the sensing light is reflected to the light receiver by the second reflective element, so that the circuit board generates a key switch signal according to the electronic signal.

In an embodiment, the light emitter and the light receiver are located at an outside of the housing, so that the sensing light is introduced into the housing from the outside of the housing and the sensing light is reflected to the outside of the housing.

In an embodiment, a light-inputting opening and a light-outputting opening are formed in a bottom surface of the housing. The light-inputting opening is located over the light emitter. The sensing light is introduced into the housing through the light-inputting opening The light-outputting opening is located over the light receiver. The sensing light is outputted from the housing through the light-outputting opening In an embodiment, the second reflective element is partially embedded in the light-outputting opening for filtering the sensing light.

In an embodiment, the first reflective element and the second reflective element are prisms.

In an embodiment, the second reflective element is an infrared filter prism for reflecting and filtering the sensing light.

In an embodiment, the first reflective element has a first reflective slant surface, and the second reflective element has a second reflective slant surface.

In an embodiment, the light emitter and the light receiver are disposed on the circuit board.

In an embodiment, the sensing light is an invisible light.

In an embodiment, the sensing light is an infrared light.

In an embodiment, the key further includes a light emitting diode and a light guide element. The light emitting diode is disposed on a surface of the circuit board. The light guide element is disposed within the housing. The light emitting diode emits a light beam. The light beam is guided by the light guide element so as to be outputted from the keycap.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments and accompanying drawings.

Figure 1:
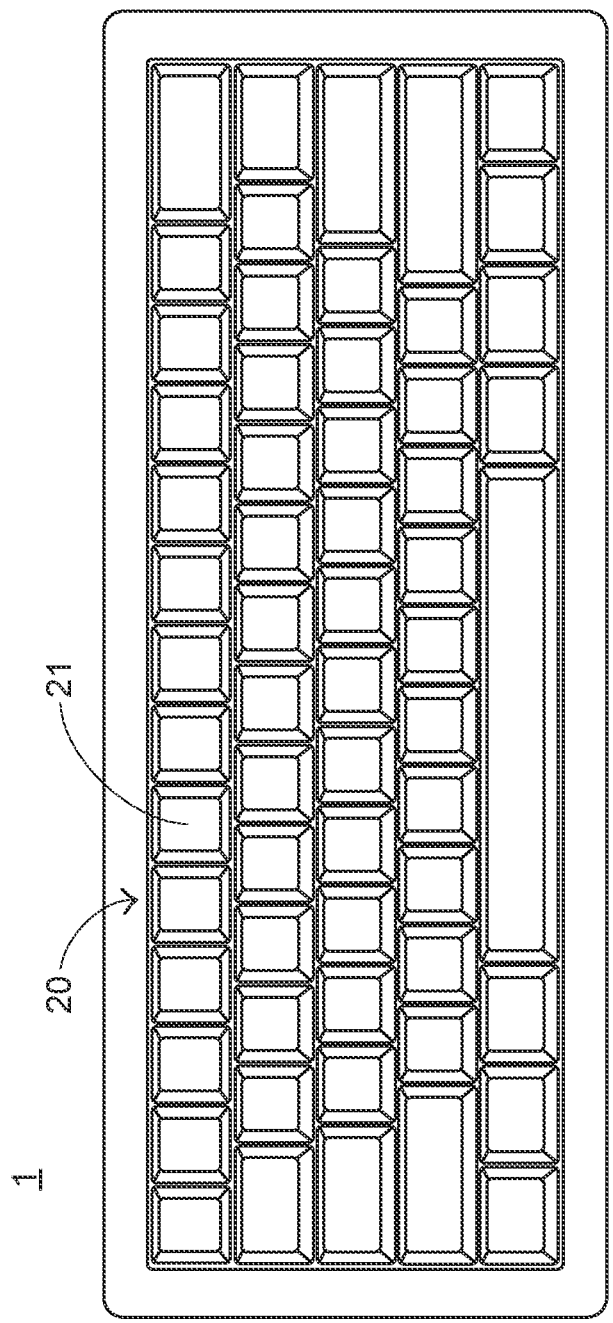
FIG. 1 is a schematic top view illustrating an optical switch keyboard according to a first embodiment of the present invention.
Figure 2:
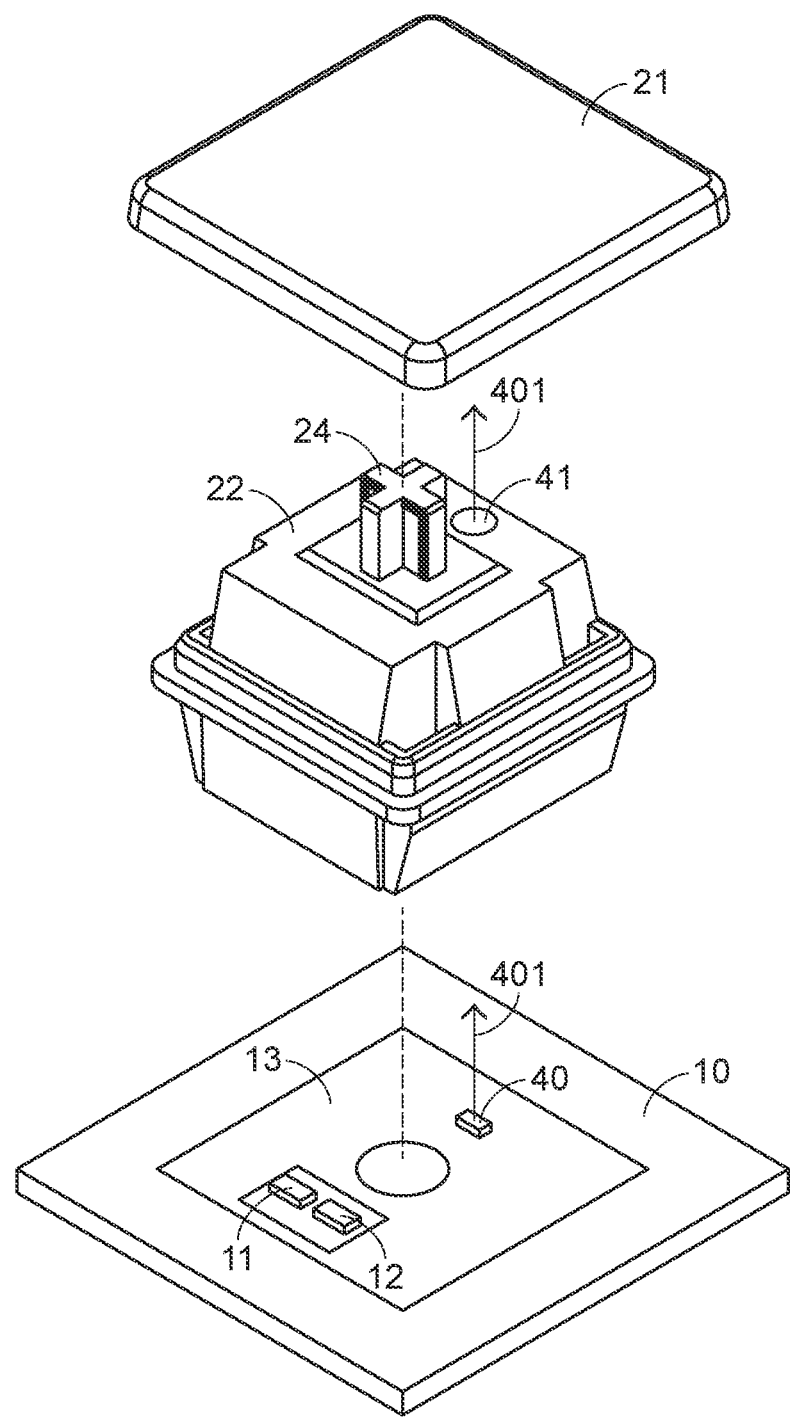
FIG. 2 is a schematic exploded view illustrating a portion of the optical switch keyboard according to the first embodiment of the present invention.

FIG. 1 is a schematic top view illustrating an optical switch keyboard according to a first embodiment of the present invention. FIG. 2 is a schematic exploded view illustrating a portion of the optical switch keyboard according to the first embodiment of the present invention. The optical switch keyboard 1 comprises a circuit board 10 and plural keys 20. Moreover, plural light emitters 11 and plural light receivers 12 are disposed on the circuit board 10. For succinctness, only one light emitter 11 and one light receiver 12 are shown in FIG. 2. Moreover, each key 20 is aligned with a corresponding light emitter 11 and a corresponding light receiver 12. In this embodiment, each key 20 comprises a keycap 21, a housing 22, a first reflective element 23 (see FIG. 6), a triggering element 24 and a second reflective element 25 (see FIG. 6).

The plural keys 20 are located over the circuit board 10. The light emitter 11 on the circuit board 10 emits a sensing light 50. Preferably, the sensing light 50 is an invisible light. The light receiver 12 is used for receiving the sensing light 50 from the corresponding light emitter 11. The housing 22 of the key 20 is located under the keycap 21. The first reflective element 23 is disposed within the housing 22 and located over the light emitter 11 in order to reflect the sensing light 50. The triggering post 24 is connected with the keycap 21 and inserted into the inner portion of housing 22. The second reflective element 25 is connected with the triggering post 24 and located over the light receiver 12. When the triggering post 24 is in a first position S1, the sensing light 50 reflected from the first reflective element 23 cannot be received by the second reflective element 25. When the triggering post 24 is in a second position S2, the sensing light 50 reflected from the first reflective element 23 is received by the second reflective element 25, and the sensing light 50 is reflected to the light receiver 12 by the second reflective element 25. Consequently, the light receiver 12 generates an electronic signal (not shown). Moreover, according to the electronic signal, the circuit board 10 generates a switch signal 51. In this embodiment, the key 20 further comprises a light emitting diode 40 and a light guide element 41. The light emitting diode 40 is disposed on a surface 13 of the circuit board 10. Moreover, the light emitting diode 40 emits a light beam 401. The light guide element 41 is disposed within the housing 22 for guiding the light beam 401 to the key 21. After the light beam 401 is outputted from the keycap 21, an illuminating function of the key 20 is achieved. A mechanism of triggering the key structure of the present invention will be illustrated in more details as follows.

Figure 3:
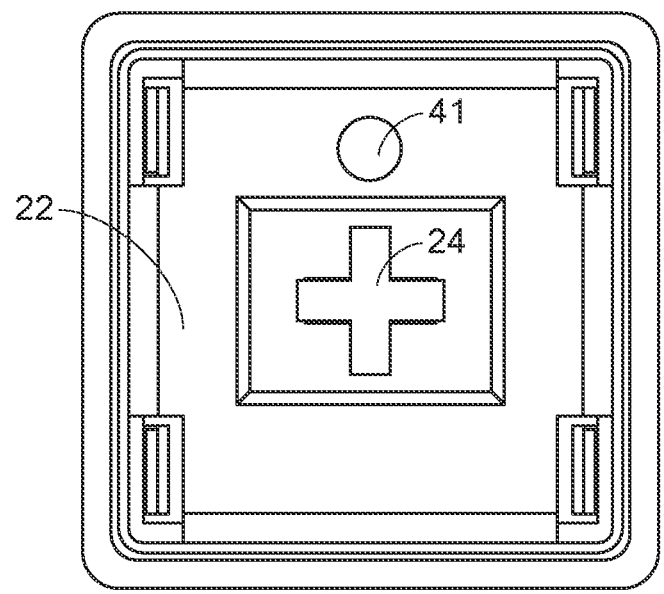
FIG. 3 is a schematic top view illustrating a portion of the key of the optical switch keyboard according to the first embodiment of the present invention.
Figure 4:
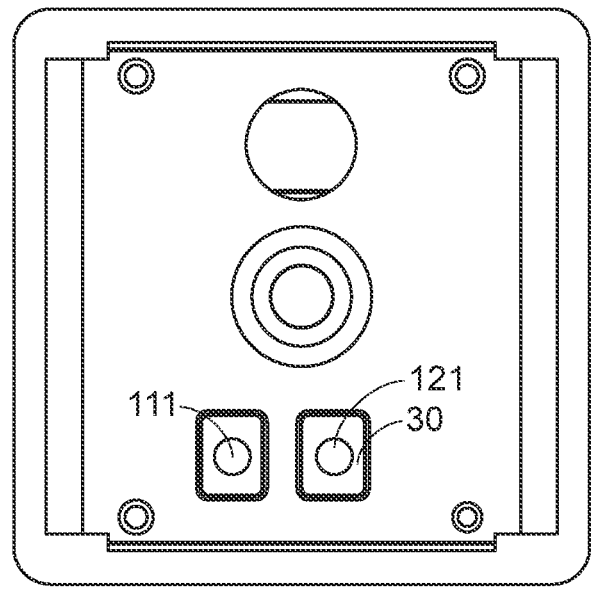
FIG. 4 is a schematic bottom view illustrating the key of the optical switch keyboard according to the first embodiment of the present invention.
Figure 5:
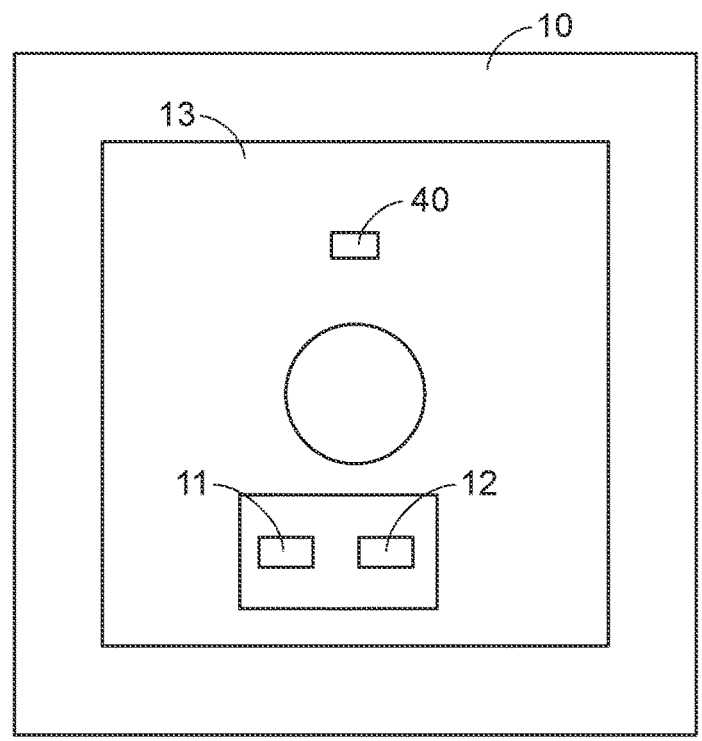
FIG. 5 is a schematic view illustrating the circuit board of the optical switch keyboard according to the first embodiment of the present invention.

Please refer to FIGS. 3, 4 and 5. FIG. 3 is a schematic top view illustrating a portion of the key of the optical switch keyboard according to the first embodiment of the present invention. FIG. 4 is a schematic bottom view illustrating the key of the optical switch keyboard according to the first embodiment of the present invention. FIG. 5 is a schematic view illustrating the circuit board of the optical switch keyboard according to the first embodiment of the present invention. The structure of one key 20 will be illustrated in more details as follows. As shown in FIG. 4, the key 20 further comprises a filter 30, a light-inputting opening 111 and a light-outputting opening 121. The filter 30 is disposed on the housing 22 and arranged between the second reflective element 25 and the light receiver 12. The light emitter 11 and the light receiver 12 are located at the outside of the housing 22 and disposed on the circuit board 10. The light-inputting opening 111 is located over the light emitter 11. The sensing light 50 is introduced into the housing 22 through the light-inputting opening 111. The light-outputting opening 121 is located over the light receiver 12. The sensing light 50 is outputted from the housing 22 through the light-outputting opening 121. Particularly, the filter 30 is disposed on a bottom surface of the housing 22 and aligned with the light-outputting opening 121.

Figure 6:
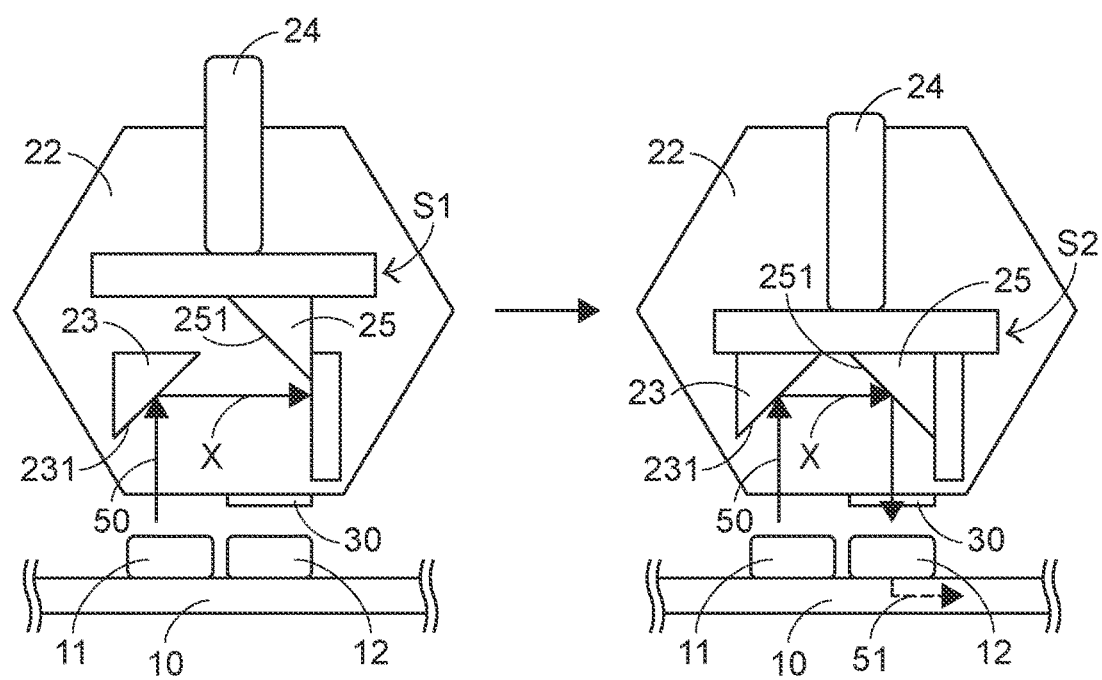
FIG. 6 schematically illustrates the action of the key of the optical switch keyboard according to the first embodiment of the present invention.

The mechanism of triggering the key 20 will be illustrated as follows. FIG. 6 schematically illustrates the action of the key of the optical switch keyboard according to the first embodiment of the present invention. When the key 20 is not depressed, the triggering post 24 is in the first position 51 because the triggering post 24 is not depressed. Meanwhile, the sensing light 50 from the light emitter 11 is introduced into the housing 22 through the light-inputting opening 111 along an optical path X. Since the first reflective element 23 is arranged in the optical path X, the sensing light 50 is reflected by a first reflective slant surface 231 of the first reflective element 23. Moreover, when the triggering post 24 is in the first position S1, the second reflective element 25 is not arranged in the optical path X. Consequently, the sensing light 50 from the first reflective element 23 cannot be received by the second reflective element 25. When the key 20 is depressed, the triggering post 24 is moved to the second position S2. Consequently, the second reflective element 25 is moved to a position in the optical path X of the sensing light 50. After the sensing light 50 from the first reflective element 23 is received by a second reflective slant surface 251 of the second reflective element 25, the sensing light 50 is reflected to the outside of the housing 22 through the light-outputting opening 121. Moreover, if the sensing light 50 is interfered by the surrounding stray light, the light receiver 12 may erroneously receive the sensing light 50 or misjudge the sensing light 50. For avoiding this problem, the sensing light 50 is transmitted through the filter 30 after the sensing light 50 is outputted from the housing 22. The surrounding stray light that possibly interferes with the sensing light 50 is filtered off by the filter 30. Then, the filtered sensing light 50 is irradiated to the light receiver 12, and thus the light receiver 12 generates the electronic signal to a controller (not shown) on the circuit board 10. According to the electronic signal, the circuit board 10 generates a key switch signal 51.

Generally, the backlight of the keyboard, the light of the light emitting diode, the natural light or any other surrounding stray light is possibly in the key or the surroundings. After the sensing light 50 is emitted by the light emitter 11, the sensing light 50 is irradiated to the surroundings. If the surrounding stray light is misjudged as the sensing light 50 by the light receiver 12, the electronic signal is erroneously generated. The filter 30 is disposed on a bottom surface of the housing 22 and aligned with the light-outputting opening 121. After the sensing light 50 is outputted from the housing 22, the surrounding stray light is filtered off by the filter 30. Consequently, the light receiver 12 can accurately receive the sensing light 50 and generates the electronic signal.

Preferably, the light emitter 11 is an infrared light source, the sensing light 50 is an infrared light, the light receiver 12 is an infrared light receiver, and the filter 30 is an infrared filter. The infrared filter is used for filtering the surrounding stray light. Consequently, only the infrared light is permitted to pass through the infrared filter. Moreover, the first reflective element 23 and the second reflective element 25 are prisms.

Figure 7:
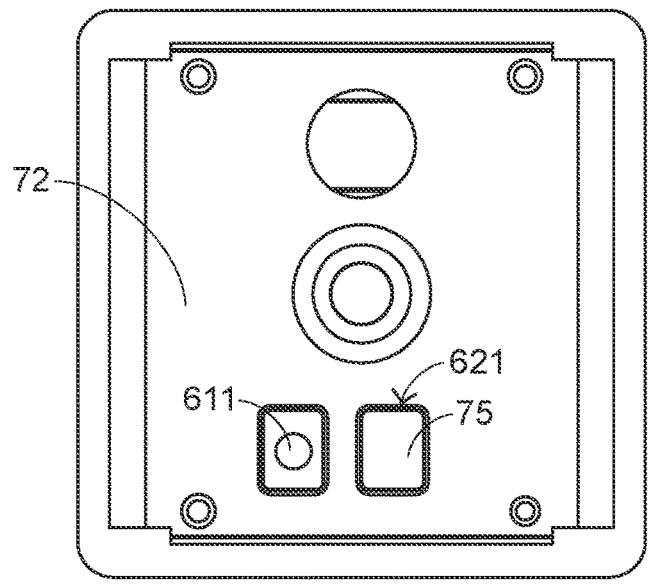
FIG. 7 is a schematic bottom view illustrating a key of the optical switch keyboard according to a second embodiment of the present invention.
Figure 8:
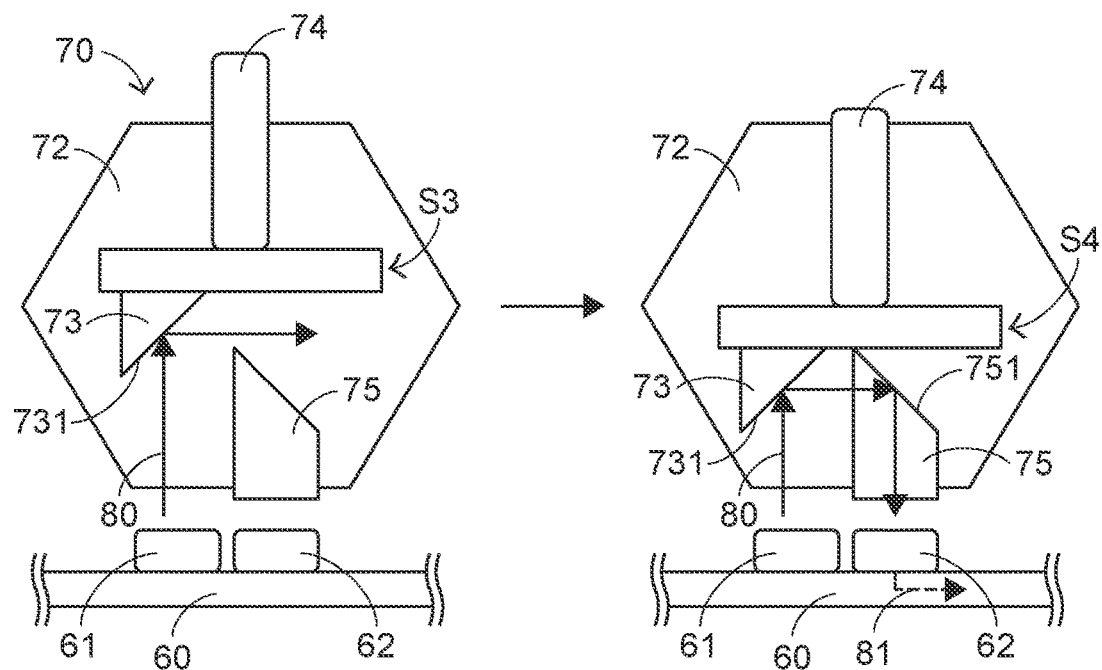
FIG. 8 schematically illustrates the action of the key of the optical switch keyboard according to the second embodiment of the present invention.

Hereinafter, an optical switch keyboard according to a second embodiment will be illustrated with reference to FIGS. 7 and 8. FIG. 7 is a schematic bottom view illustrating a key of the optical switch keyboard according to a second embodiment of the present invention. FIG. 8 schematically illustrates the action of the key of the optical switch keyboard according to the second embodiment of the present invention. The components and the operations of the optical switch keyboard that are similar to the first embodiment are not redundantly described herein. In this embodiment, the optical switch keyboard comprises a circuit board 60 and plural keys 70. Moreover, plural light emitters 61 and plural light receivers 62 are disposed on the circuit board 60. The light emitter 61 emits a sensing light 80. Preferably, the sensing light 80 is an invisible light. The light receiver 62 is used for receiving the sensing light 80 from the corresponding light emitter 61. The keys 70 are located over the circuit board 60. Moreover, each key 70 is aligned with a corresponding light emitter 61 and a corresponding light receiver 62. In this embodiment, each key 70 comprises a keycap (not shown), a housing 72, a first reflective element 73, a triggering element 74 and a second reflective element 75. The first reflective element 73 is connected with the triggering post 74 and located over the light emitter 61. Moreover, the first reflective element 73 is moved with the triggering post 74. The second reflective element 75 is connected with the housing 72 and located over the light receiver 62. The light emitter 61 and the light receiver 62 are disposed on the circuit board 60 and located outside the housing 72. Moreover, a light-inputting opening 611 and a light-outputting opening 621 are formed in a bottom surface of the housing 72. The light-inputting opening 611 is located over the light emitter 61. The sensing light 80 is introduced into the housing 72 through the light-inputting opening 611. The light-outputting opening 621 is located over the light receiver 62. The sensing light 80 is outputted from the housing 72 through the light-outputting opening 621. The second reflective element 75 is partially embedded in the light-outputting opening 621. More especially, the second reflective element 75 has a filtering function.

The mechanism of triggering the key 70 will be illustrated as follows. When the key 70 is not depressed, the triggering post 74 is in the first position S3 because the triggering post 74 is not depressed. Meanwhile, the sensing light 80 from the light emitter 61 is introduced into the housing 72 through the light-inputting opening 611. Then, the sensing light 80 is reflected by a first reflective slant surface 731 of the first reflective element 73. Since the optical path of the reflected sensing light 80 is at the level higher than the second reflective element 75, the sensing light 80 reflected by the first reflective element 73 cannot be received by the second reflective element 75. That is, the sensing light 80 is not reflected by the second reflective element 75. When the key 70 is depressed, the triggering post 74 is moved to the second position S4. Consequently, the first reflective element 73 is moved downwardly. After the sensing light 80 is reflected by the first reflective slant surface 731 of the first reflective element 73, the sensing light 80 is directed to the second reflective element 75. After the sensing light 80 is received by the second reflective element 75, the sensing light 80 is reflected by a second reflective slant surface 751 of the second reflective element 75. Then, the sensing light 80 is reflected to the outside of the housing 72. Moreover, the backlight of the keyboard, the light of the light emitting diode, the natural light or any other surrounding stray light in the surroundings is filtered by the second reflective element 75. Consequently, the light receiver 62 can accurately receive the sensing light 80. Then, the light receiver 62 generates an electronic signal (not shown) to a controller (not shown) on the circuit board 60. According to the electronic signal, the circuit board 60 generates a key switch signal 81.

Preferably, the light emitter 61 is an infrared light source, the sensing light 80 is an infrared light, and the light receiver 62 is an infrared light receiver. Moreover, the first reflective element 73 and the second reflective element 75 are prisms. More preferably, the second reflective element 75 is an infrared filter prism. Consequently, only the infrared light is permitted to pass through the second reflective element 75, and the surrounding stray light is filtered off by the second reflective element 75. Optionally, the key of optical switch keyboard of this embodiment further comprises a light emitting diode and a light guide element. The structures, arrangements and functions of the light emitting diode and the light guide element are similar to those of the first embodiment, and are not redundantly described herein.

Figure 9:
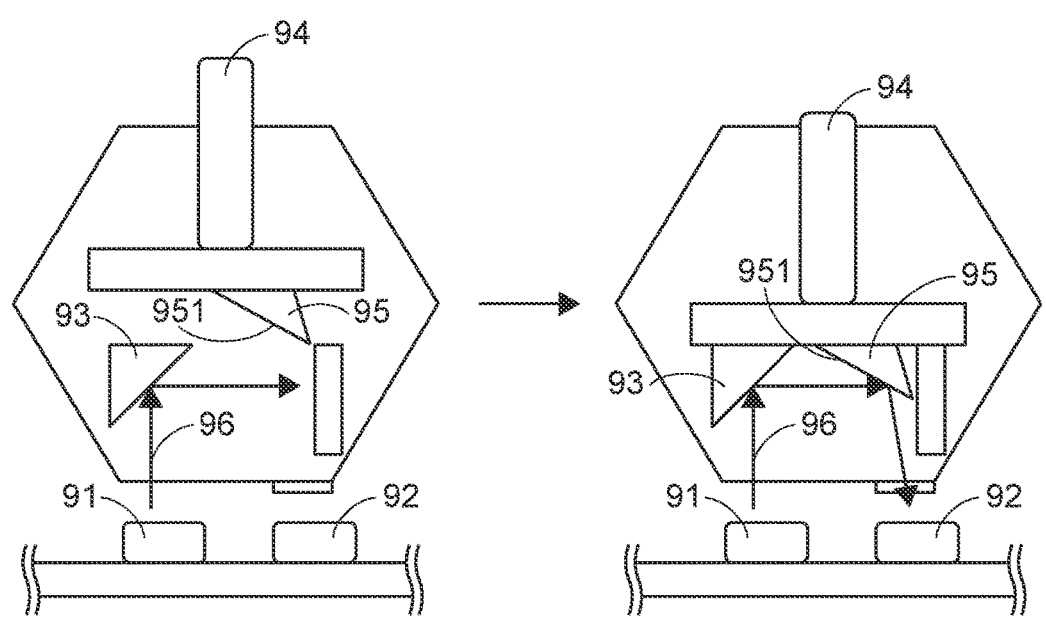
FIG. 9 schematically illustrates the action of the key of the optical switch keyboard according to a third embodiment of the present invention.

Hereinafter, an optical switch keyboard according to a third embodiment will be illustrated with reference to FIG. 9. FIG. 9 schematically illustrates the action of the key of the optical switch keyboard according to a third embodiment of the present invention. The components and the operations of the optical switch keyboard that are similar to the first embodiment are not redundantly described herein. In this embodiment, each key of the optical switch keyboard comprises a light emitter 91, a light receiver 92, a first reflective element 93, a triggering element 94 and a second reflective element 95. Generally, the distance between the light emitter 91 and the light receiver 92 may be varied according to the specifications of the optical switch keyboard. In this embodiment, the relative position between the first reflective element 93 and the second reflective element 95 is adjusted according to the distance between the light emitter 91 and the light receiver 92. That is, after the distance between the light emitter 91 and the light receiver 92 is realized, the relative position between the first reflective element 93 and the second reflective element 95 is adjusted. Consequently, the optical path of reflecting the sensing light 96 is adjusted. In an example, by changing the position of the first reflective element 93, a slope of the first reflective slant surface of the first reflective element 93 is adjusted. In another embodiment, by changing the position of the second reflective element 95, a slope of the second reflective slant surface of the second reflective element 95 is adjusted. As the slope of the reflective slant surface is changed, the reflection angle of the sensing light is changed and the optical path of reflecting the sensing light is deflected. Under this circumstance, the sensing light is projected on a different position. For example, the distance between the light emitter 91 and the light receiver 92 in this embodiment is larger because the light receiver 92 is farther from the light emitter 91. In this embodiment, the slope of the second reflective slant surface 951 of the second reflective element 95 is adjusted. As shown in FIG. 9, the sensing light 96 from the light emitter 91 is reflected by the first reflective element 93. When the triggering element 94 is depressed, the second reflective element 95 is moved to a position in the optical path of the sensing light 96. Since the slope of the second reflective slant surface 951 is increased, the optical path of reflecting the sensing light 96 is deflected. Under this circumstance, the distance between the light-inputting position and the light-outputting position is increased, and the light-outputting position is aligned with the farther light receiver 92. Consequently, the sensing light 96 can be accurately received by the light receiver 92.

From the above descriptions, the present invention provides an optical switch keyboard. A light emitter and a light receiver of the optical switch keyboard are located at the outside of the key. Consequently, the structure of the key will be simplified, and the optical components can be replaced and adjusted more easily. Moreover, the optical switch keyboard has the functions of filtering other stray lights and noise, and thus the sensitivity and accuracy of the optical key in judgment are both enhanced. In other words, the use of the optical switch keyboard of the present invention can overcome the drawbacks of the conventional technologies.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:
1. An optical switch keyboard, comprising:
a circuit board comprising plural light emitters and plural light receivers, wherein each light emitter emits a sensing light, and each light receiver generates an electronic signal when the sensing light from the corresponding light emitter is received by the light receiver; and
plural keys located over the circuit board, wherein each key is aligned with the corresponding light emitter and the corresponding light receiver, and each key comprises:
a keycap;
a housing located under the keycap;
a first reflective element disposed within the housing and located over the light emitter, wherein the sensing light is reflected by the first reflective element; and
a triggering post connected with the keycap and inserted into housing, wherein a second reflective element is connected with the triggering post and located over the light receiver, wherein when the triggering post is in a first position, the sensing light from the first reflective element is not received by the second reflective element, wherein when the triggering post is in a second position, the sensing light from the first reflective element is received by the second reflective element and the sensing light is reflected to the light receiver by the second reflective element, so that the circuit board generates a key switch signal according to the electronic signal.

2. The optical switch keyboard according to claim 1, wherein when the triggering post is in the second position, the second reflective element is in an optical path of the sensing light, and the sensing light is reflected to the light receiver by the second reflective element.

3. The optical switch keyboard according to claim 1, wherein the light emitter and the light receiver are located at an outside of the housing, so that the sensing light is introduced into the housing from the outside of the housing and the sensing light is reflected to the outside of the housing.

4. The optical switch keyboard according to claim 3, wherein the key further comprises a filter, wherein the filter is disposed on the housing and arranged between the second reflective element and the light receiver for filtering the sensing light.

5. The optical switch keyboard according to claim 3, wherein a light-inputting opening and a light-outputting opening are formed in a bottom surface of the housing, wherein the light-inputting opening is located over the light emitter, and the sensing light is introduced into the housing through the light-inputting opening, wherein the light-outputting opening is located over the light receiver, and the sensing light is outputted from the housing through the light-outputting opening.

6. The optical switch keyboard according to claim 5, wherein the key further comprises a filter, and the filter is disposed on the bottom surface of the housing and aligned with the light-outputting opening.

7. The optical switch keyboard according to claim 1, wherein the first reflective element has a first reflective slant surface, and the second reflective element has a second reflective slant surface.

8. The optical switch keyboard according to claim 1, wherein the first reflective element and the second reflective element are prisms.

9. The optical switch keyboard according to claim 1, wherein the light emitter and the light receiver are disposed on the circuit board.

10. The optical switch keyboard according to claim 1, wherein the sensing light is an invisible light.

11. The optical switch keyboard according to claim 1, wherein the sensing light is an infrared light.

12. The optical switch keyboard according to claim 1, wherein the key further comprises a light emitting diode and a light guide element, wherein the light emitting diode is disposed on a surface of the circuit board, and the light guide element is disposed within the housing, wherein the light emitting diode emits a light beam, and the light beam is guided by the light guide element so as to be outputted from the keycap.

13. An optical switch keyboard, comprising:
a circuit board comprising plural light emitters and plural light receivers, wherein each light emitter emits a sensing light, and each light receiver generates an electronic signal when the sensing light from the corresponding light emitter is received by the light receiver; and
plural keys located over the circuit board, wherein each key is aligned with the corresponding light emitter and the corresponding light receiver, and each key comprises:
a keycap;
a housing located under the keycap;
a triggering post disposed within the housing and connected with the keycap, wherein a first reflective element is connected with the triggering post and located over the light emitter, and the sensing light is reflected by the first reflective element; and
a second reflective element connected with the housing and located over the light receiver, wherein when the triggering post is in a first position, the sensing light from the first reflective element is not reflected to the second reflective element, wherein when the triggering post is in the second position, the sensing light from the first reflective element is reflected to the second reflective element and the sensing light is reflected to the light receiver by the second reflective element, so that the circuit board generates a key switch signal according to the electronic signal.

14. The optical switch keyboard according to claim 13, wherein the light emitter and the light receiver are located at an outside of the housing, so that the sensing light is introduced into the housing from the outside of the housing and the sensing light is reflected to the outside of the housing.

15. The optical switch keyboard according to claim 13, wherein a light-inputting opening and a light-outputting opening are formed in a bottom surface of the housing, wherein the light-inputting opening is located over the light emitter, and the sensing light is introduced into the housing through the light-inputting opening, wherein the light-outputting opening is located over the light receiver, and the sensing light is outputted from the housing through the light-outputting opening.

16. The optical switch keyboard according to claim 15, wherein the second reflective element is partially embedded in the light-outputting opening for filtering the sensing light.

17. The optical switch keyboard according to claim 13, wherein the first reflective element and the second reflective element are prisms.

18. The optical switch keyboard according to claim 13, wherein the second reflective element is an infrared filter prism for reflecting and filtering the sensing light.

19. The optical switch keyboard according to claim 13, wherein the first reflective element has a first reflective slant surface, and the second reflective element has a second reflective slant surface.

20. The optical switch keyboard according to claim 13, wherein the light emitter and the light receiver are disposed on the circuit board.

21. The optical switch keyboard according to claim 13, wherein the sensing light is an invisible light.

22. The optical switch keyboard according to claim 13, wherein the sensing light is an infrared light.

23. The optical switch keyboard according to claim 13, wherein the key further comprises a light emitting diode and a light guide element, wherein the light emitting diode is disposed on a surface of the circuit board, and the light guide element is disposed within the housing, wherein the light emitting diode emits a light beam, and the light beam is guided by the light guide element so as to be outputted from the keycap.

* * * * *